United States Patent
Kung

(10) Patent No.: US 10,573,614 B2
(45) Date of Patent: Feb. 25, 2020

(54) PROCESS FOR FABRICATING A CIRCUIT SUBSTRATE

(71) Applicant: VIA Technologies, Inc., New Taipei (TW)

(72) Inventor: Chen-Yueh Kung, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 0 days.

(21) Appl. No.: 16/121,654

(22) Filed: Sep. 5, 2018

(65) Prior Publication Data

US 2019/0006302 A1    Jan. 3, 2019

Related U.S. Application Data

(62) Division of application No. 14/054,850, filed on Oct. 16, 2013, now Pat. No. 10,103,115.

(30) Foreign Application Priority Data

Aug. 28, 2013 (TW) .............................. 102130846 A

(51) Int. Cl.
*H01L 23/00* (2006.01)
*H01L 23/498* (2006.01)

(52) U.S. Cl.
CPC ........ *H01L 24/11* (2013.01); *H01L 23/49811* (2013.01); *H01L 24/32* (2013.01); *H01L 23/49816* (2013.01); *H01L 24/13* (2013.01); *H01L 24/16* (2013.01); *H01L 2224/131* (2013.01); *H01L 2224/16225* (2013.01); *H01L 2224/16227* (2013.01); *H01L 2224/32059* (2013.01); *H01L 2224/32225* (2013.01); *H01L 2224/32238* (2013.01);

(Continued)

(58) Field of Classification Search
CPC ........... H01L 24/11; H01L 2224/16227; H01L 2224/32238; H01L 2924/15311; H01L 23/49816; H05K 3/3452
See application file for complete search history.

(56) References Cited

U.S. PATENT DOCUMENTS

2005/0070084 A1*  3/2005  Hsu .................. H01L 24/11
                                                 438/612
2007/0281557 A1* 12/2007  Shih ................. H01L 21/4846
                                                 439/876

(Continued)

*Primary Examiner* — Bitew A Dinke
(74) *Attorney, Agent, or Firm* — JCIPRNET

(57) ABSTRACT

A process for fabricating a circuit substrate is provided. A dielectric layer is formed to cover a surface of a circuit stack and a patterned conductive layer, and has bonding openings exposing bonding segments of traces of the patterned conductive layer, and has plating openings exposing plating segments of the traces. A plating seed layer is formed to cover the surface of the circuit stack, the bonding segments, the plating segments, and the dielectric layer. A mask is formed to cover the plating layer and has mask openings exposing portions of the plating seed layer on the bonding segments. Portions of the plating seed layer on the bonding segments are removed with use of the mask as an etching mask. A thickening conductive layer is plated on each of the bonding segments with use of the mask as a plating mask. The mask and the plating seed layer are removed.

5 Claims, 13 Drawing Sheets

(52) U.S. Cl.
CPC .............. *H01L 2224/73204* (2013.01); *H01L 2224/83385* (2013.01); *H01L 2924/15311* (2013.01)

(56) References Cited

U.S. PATENT DOCUMENTS

| | | | |
|---|---|---|---|
| 2009/0096079 A1* | 4/2009 | Park .................... | H01L 23/3128 257/690 |
| 2009/0096099 A1* | 4/2009 | Hsu .................... | H01L 23/49811 257/738 |
| 2009/0294962 A1* | 12/2009 | Hsu .................... | H01L 23/49816 257/738 |
| 2010/0007015 A1* | 1/2010 | Gallegos ............... | H01L 21/563 257/737 |
| 2011/0056738 A1* | 3/2011 | Hu ...................... | H01L 21/4853 174/261 |
| 2011/0074026 A1* | 3/2011 | Shim ................... | H01L 21/4846 257/737 |
| 2012/0032343 A1* | 2/2012 | Lin ........................ | H01L 24/17 257/774 |
| 2012/0152606 A1* | 6/2012 | Kurokawa ........ | H01L 23/49827 174/262 |
| 2012/0181688 A1* | 7/2012 | Hsu ....................... | H01L 23/498 257/737 |
| 2013/0249076 A1* | 9/2013 | Lee ....................... | H01L 23/498 257/737 |
| 2015/0021762 A1* | 1/2015 | Williamson ...... | H01L 23/49816 257/737 |

* cited by examiner

PROCESS FOR FABRICATING A CIRCUIT SUBSTRATE

CROSS-REFERENCE TO RELATED APPLICATION

This application is a divisional application of and claims the priority benefit of U.S. application Ser. No. 14/054,850, filed on Oct. 16, 2013, now allowed, which claims the priority benefit of Taiwan application serial no. 102130846, filed on Aug. 28, 2013. The entirety of each of the above-mentioned patent applications is hereby incorporated by reference herein and made a part of this specification.

BACKGROUND OF THE INVENTION

Field of the Invention

The invention relates to a circuit substrate applicable in a semiconductor package field, a semiconductor package structure, and a process for fabricating a circuit substrate.

Description of Related Art

In the existing semiconductor package technical field, die carriers are commonly used for the interconnection between integrated circuit (IC) dies and the next-level electronic devices, such as motherboards, module boards, etc. A circuit substrate characterized by high layout density often serves as a die carrier with high pin count. The conventional circuit substrate is mainly composed of a plurality of patterned conductive layers and a plurality of dielectric layers alternately stacked to one another, and the patterned conductive layers are electrically connected through a plurality of conductive vias.

According to a flip-die bonding technique (a die package technology for high-pin-count applications), the circuit substrate is often employed as the die carrier, and the dies are electrically connected to a plurality of bonding pads of the circuit substrate by means of a plurality of conductive bumps arranged in area array. In order to reduce the pitch among the bonding pads for increasing the density of the bonding pads, large-sized openings on a solder mask layer on the circuit substrate may be applied to completely expose a die bonding region on the circuit substrate according to the related art, and traces on the circuit substrate are soldered to the corresponding conductive bumps through bonding segments of the traces in the die bonding region.

In view of the above, when a transitional segment of another trace exists between two adjacent bonding segments, the transitional segment need be narrowed down to reduce the distance between the two adjacent bonding segments. However, the transitional segment can only be narrowed down to a certain extent because the transitional segment must be capable of electrical transmission. This is unfavorable to the reduction of the pitch between the two adjacent bonding segments. In addition, the bonding area occupied by the bonding segments is determined by the widths and the thicknesses of the traces. To ensure the sufficient bonding area of the bonding segments, the traces can also be narrowed down only to a certain extent, which is also unfavorable to the reduction of the pitch between two adjacent bonding segments.

SUMMARY OF THE INVENTION

The invention is directed to a process for fabricating a circuit substrate applicable to a semiconductor package technical field.

In an embodiment of the invention, a process for fabricating a circuit substrate includes followings steps. A circuit stack and a patterned conductive layer are provided. Here, the circuit stack has a surface, the patterned conductive layer is located on the surface of the circuit stack and has a plurality of traces, and each of the traces has a bonding segment and a plating segment. A dielectric layer is formed to cover the surface of the circuit stack and the patterned conductive layer, and the dielectric layer has a plurality of bonding openings and a plurality of plating openings. Each of the bonding openings exposes a corresponding bonding segment of the bonding segments, and each of the plating openings exposes a corresponding plating segment of the plating segments. A plating seed layer is formed to cover the surface of the circuit stack, the bonding segments, the plating segments, and the dielectric layer. A mask is formed to cover the plating seed layer. Here, the mask has a plurality of mask openings, and each of the mask openings exposes a portion of the plating seed layer on a corresponding bonding segment of the bonding segments. The plating seed layer is etched with use of the mask as an etching mask, so as to remove the portions of the plating seed layer on the corresponding bonding segments and expose the corresponding bonding segments, wherein the plating segments is covered by the plating seed layer. A thickening conductive layer is plated on each of the bonding segments through the plating seed layer and the traces with use of the mask as a plating mask. The mask and the plating seed layer are removed.

In view of the above, the thickening conductive layers are formed on the bonding segments, so as to increase the widths and the heights of the bonding segments and thereby expand the bonding area. Besides, in the process for fabricating the circuit substrate described herein, the plating segments of the traces are exposed by the plating openings of the dielectric layer, and the exposed plating segments can then serve as the current path for plating the thickening conductive layers on the bonding segments of the traces.

Several exemplary embodiments accompanied with figures are described in detail below to further describe the invention in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1:
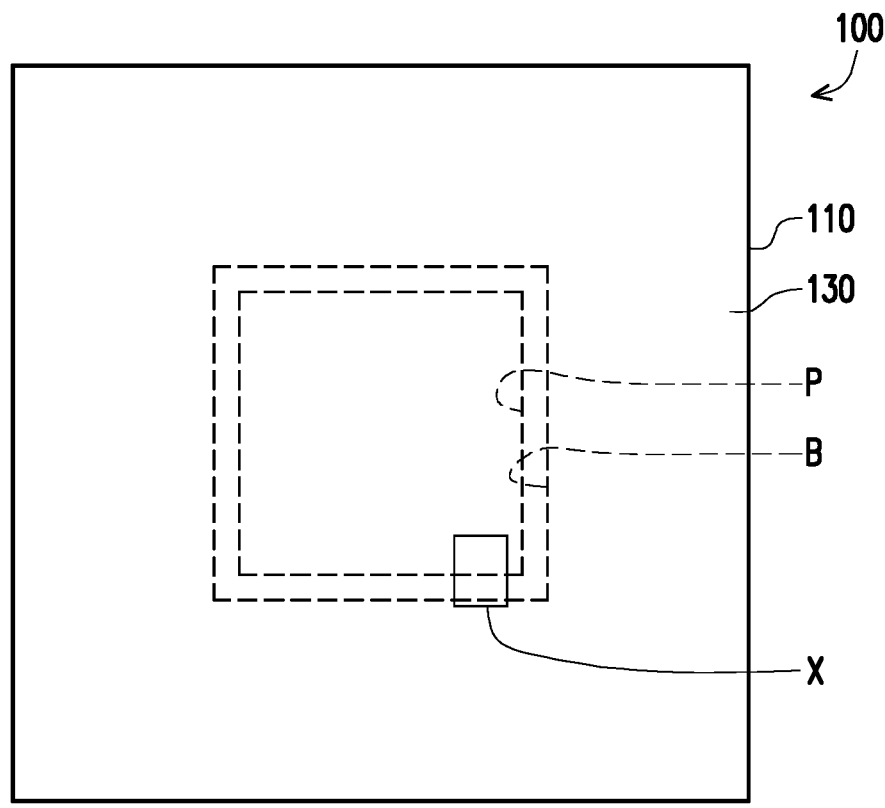
FIG. 1 is a top view illustrating a circuit substrate according to an embodiment of the invention.
Figure 2:
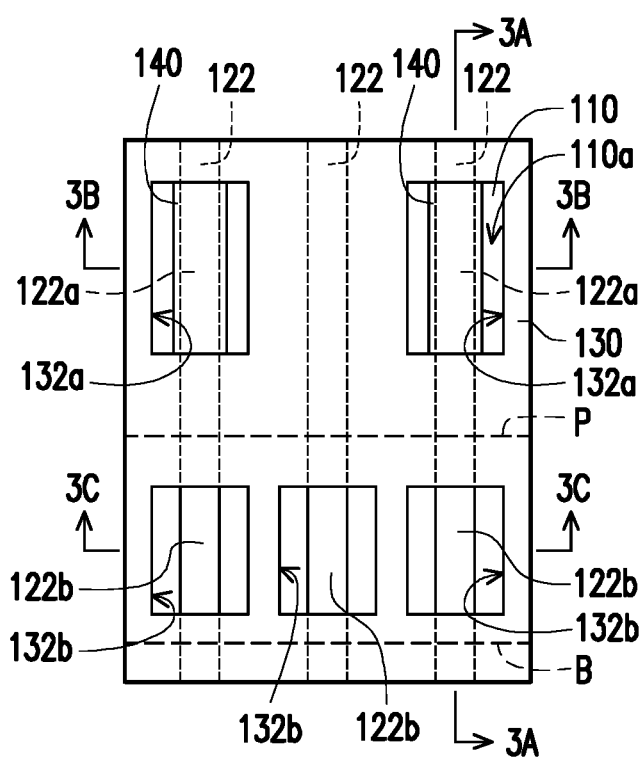
FIG. 2 is an enlarged view illustrating the X portion of the circuit substrate depicted in FIG. 1.
Figure 3A:
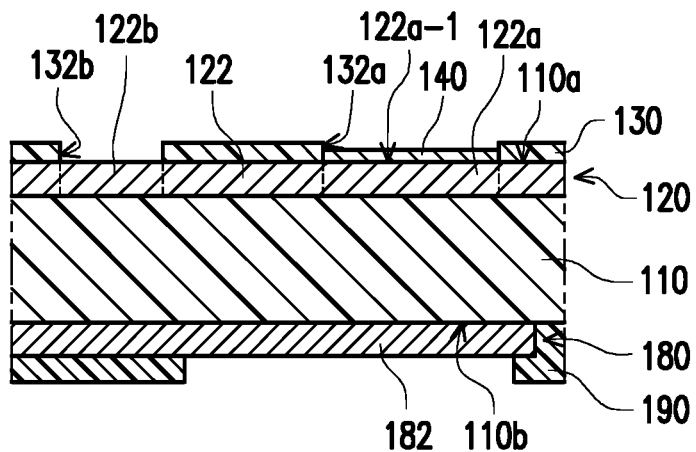
FIG. 3A is a cross-sectional view illustrating a portion of the circuit substrate depicted in FIG. 2 taken along line 3A-3A.
Figure 3B:
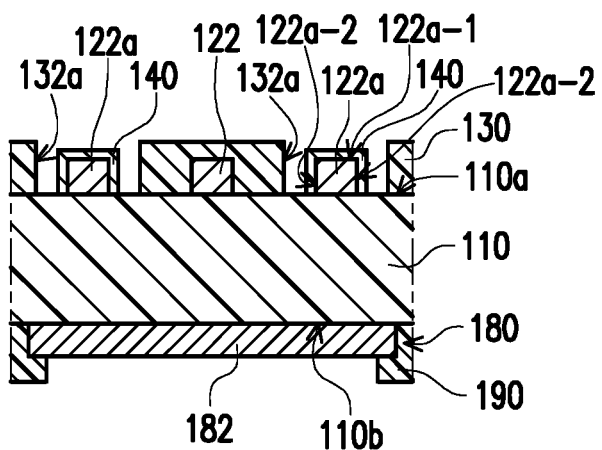
FIG. 3B is a cross-sectional view illustrating a portion of the circuit substrate depicted in FIG. 2 taken along line 3B-3B.
Figure 3C:
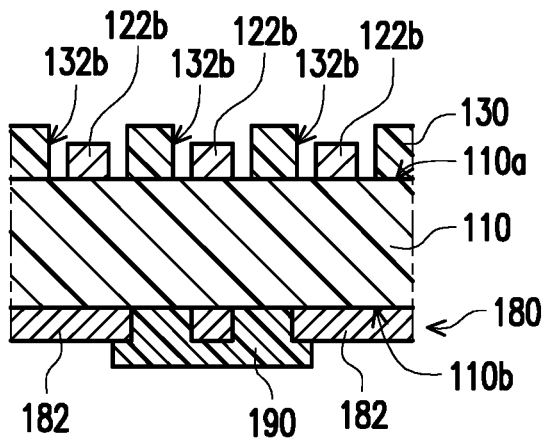
FIG. 3C is a cross-sectional view illustrating a portion of the circuit substrate depicted in FIG. 2 taken along line 3C-3C.

FIG. 1 is a top view illustrating a circuit substrate according to an embodiment of the invention. FIG. 2 is an enlarged view illustrating the X portion of the circuit substrate depicted in FIG. 1. FIG. 3A is a cross-sectional view illustrating a portion of the circuit substrate depicted in FIG. 2 taken along line 3A-3A. FIG. 3B is a cross-sectional view illustrating a portion of the circuit substrate depicted in FIG. 2 taken along line 3B-3B. FIG. 3C is a cross-sectional view illustrating a portion of the circuit substrate depicted in FIG. 2 taken along line 3C-3C. With reference to FIG. 1, FIG. 2, and FIG. 3A to FIG. 3C, a circuit substrate 100 described in the present embodiment includes a circuit stack 110. The circuit stack 110 has a surface 110a. In the present embodiment, the circuit stack 110 is composed of a plurality of patterned conductive layers and one or more dielectric layers alternately stacked to one another, and the patterned conductive layers may be electrically connected through conductive vias. However, the invention is not limited thereto, and the circuit stack 110 in other embodiments not shown in the drawings may be composed of alternately stacked patterned conductive layers and dielectric layers in other quantities. Besides, in another embodiment that is not shown in the drawings, the circuit stack 110 may be composed of one single dielectric layer.

As shown in FIG. 1, FIG. 2, and FIG. 3A to FIG. 3C, a circuit substrate 100 described in the present embodiment further includes a patterned conductive layer 120, a dielectric layer 130, and a plurality of thickening conductive layers 140. The patterned conductive layer 120 is located on the surface 110a of the circuit stack 110 and has a plurality of traces 122. Each of the traces 122 has a bonding segment 122a. The dielectric layer 130 (e.g., a solder mask layer) is located on the surface 110a and covers the patterned conductive layer 120. Besides, the dielectric layer 130 has a plurality of bonding openings 132a, and each of the bonding openings 132a exposes a corresponding bonding segment 122a. Each of the thickening conductive layers 140 is located on the corresponding bonding segment 122a.

Note that the bonding segment of each conventional trace is merely a small line segment of the trace, and thus the thickness and the width of the conventional bonding segment are respectively the same as the thickness and the width of the conventional trace having the conventional bonding segment. Nevertheless, in the present embodiment, the thickening conductive layers 140 are formed on the bonding segments 122a of the traces 122, and thus a total of a width of each of the thickening conductive layers 140 and a width of the corresponding bonding segment 122a is greater than a width of the corresponding trace 122 having the bonding segments 122a, and a total of a thickness of each of the thickening conductive layers 140 and a thickness of the corresponding bonding segment 122a is greater than a thickness of the corresponding trace 122. Hence, the thickening conductive layers are formed on the bonding segments, so as to increase the widths and the heights of the bonding segments and thereby expand the bonding area.

Figure 4A:
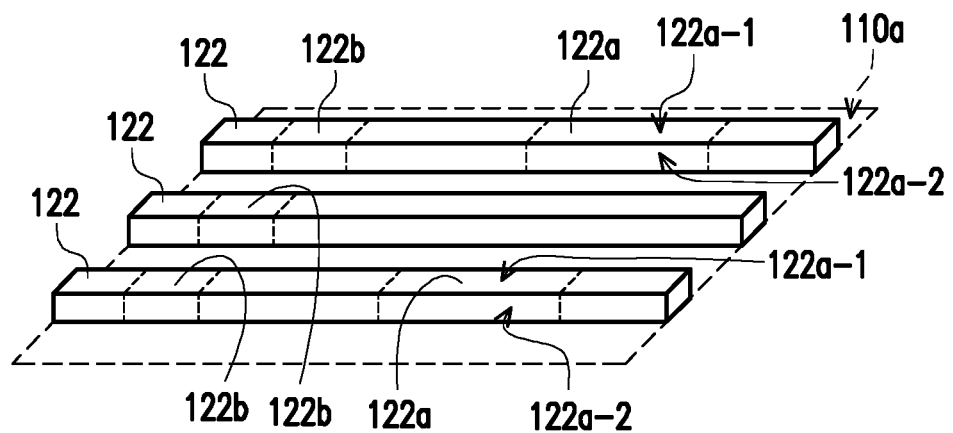
FIG. 4A is a three-dimensional view illustrating parts of the traces of the patterned conductive layer of a portion of the circuit substrate depicted in FIG. 2.
Figure 4B:
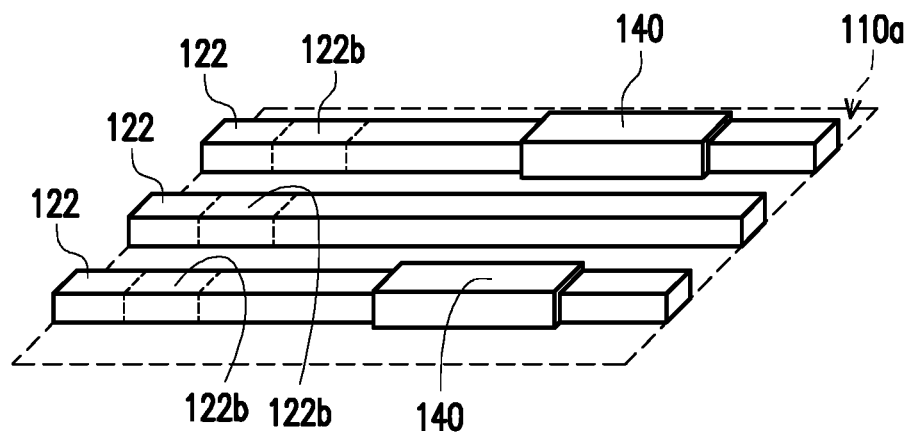
FIG. 4B is a three-dimensional view illustrating thickening conductive layers and parts of the traces of the patterned conductive layer of a portion of the circuit substrate depicted in FIG. 2.

FIG. 4A is a three-dimensional view illustrating parts of the traces of the patterned conductive layer of a portion of the circuit substrate depicted in FIG. 2. FIG. 4B is a three-dimensional view illustrating thickening conductive layers and parts of the traces of the patterned conductive layer of a portion of the circuit substrate depicted in FIG. 2. With reference to FIG. 3A, FIG. 3B, FIG. 4A, and FIG. 4B, each of the bonding segments 122a has a top surface 122a-1 and two side surfaces 122a-2. The top surface 122a-1 is away from the surface 110a, the two side surfaces 122a-2 respectively extend from two sides of the top surface 122a-1 to the surface 110a, and each of the thickening conductive layers 140 is located on the top surface 122a-1 and the two side surfaces 122a-1 of the corresponding bonding segment 122a.

With reference to FIG. 1, FIG. 2, FIG. 3B, and FIG. 3C, each of the traces 122 has a plating segment 122b, the dielectric layer 130 has a plurality of plating openings 132b, and each of the plating openings 132b exposes a corresponding plating segment 122b. Besides, the circuit stack 110 has a die bonding region B, and the bonding openings 132a and the plating openings 132b are located in the die bonding region B. The circuit stack 110 further has a die projection region P, and the bonding openings 132a are located in the die projection region P. In another embodiment that is not shown in the drawings, when the pitch between the adjacent traces 122 is reduced, the plating openings 132b may be replaced by a relatively large plating opening. Namely, the relatively large plating opening simultaneously exposes a plurality of the traces 122 and the corresponding plating segments 122b.

The usage of the plating segments 122b is elaborated in the following embodiment regarding the process for fabricating the circuit substrate.

With reference to FIG. 1 and FIG. 3A to FIG. 3C, the circuit substrate 100 further includes another patterned conductive layer 180 and another dielectric layer 190, and the circuit stack 110 further includes another surface 110b. The patterned conductive layer 180 is located on the surface 110b and has a plurality of bonding pads 182. The dielectric layer 190 (e.g., the solder mask layer) is located on the surface 110a and covers the patterned conductive layer 180, but the dielectric layer 190 exposes the bonding pads 182 of the patterned conductive layer 180. Hence, the patterned conductive layer 120 is electrically connected to the patterned conductive layer 180 through the circuit stack 110 and is electrically connected to the next-level electronic device (not shown) through the bonding pads 182.

Figure 5:
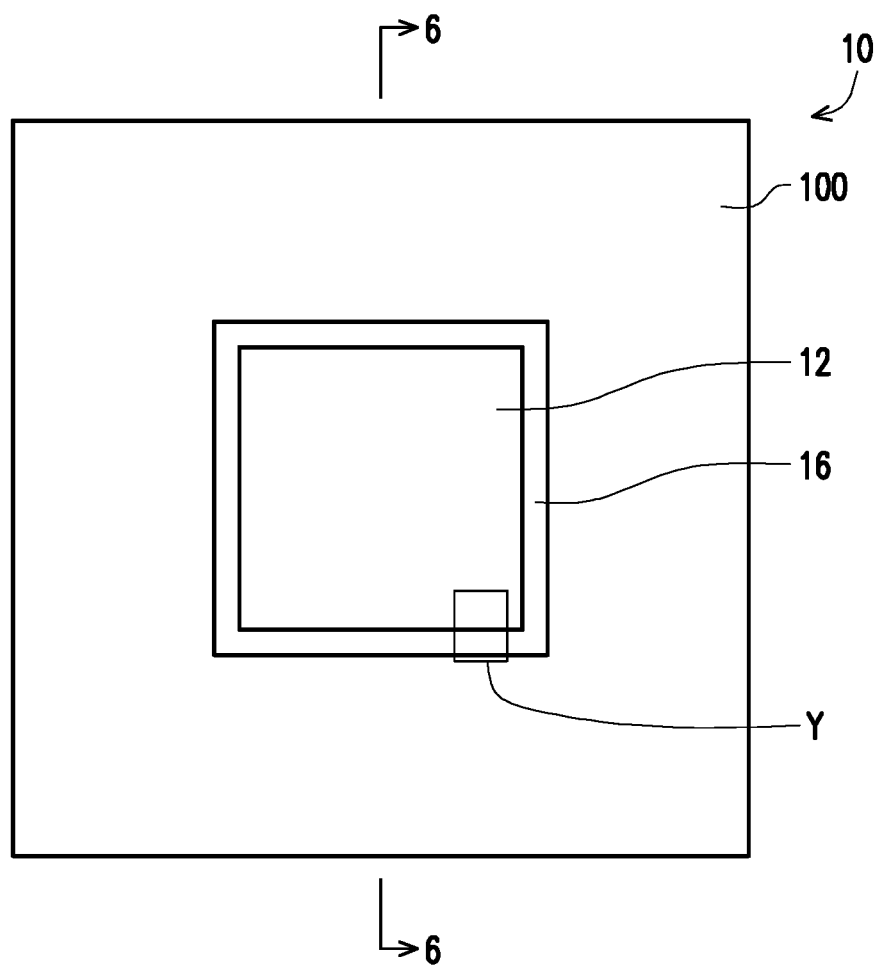
FIG. 5 is a top view illustrating a semiconductor package structure according to an embodiment of the invention.
Figure 6:
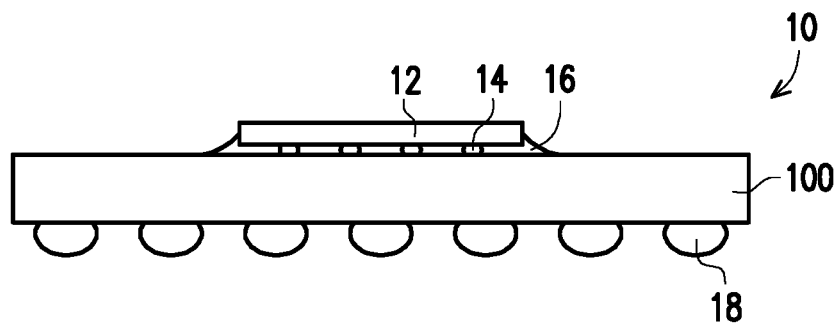
FIG. 6 is a cross-sectional view illustrating a semiconductor package structure depicted in FIG. 5 taken along line 6-6.

FIG. 5 is a top view illustrating a semiconductor package structure according to an embodiment of the invention. FIG. 6 is a cross-sectional view illustrating a semiconductor package structure depicted in FIG. 5 taken along line 6-6. With reference to FIG. 5 and FIG. 6, the semiconductor package structure 10 described in the present embodiment includes a die 12 and the circuit substrate 100 described in the previous embodiment, and the die 12 is connected to the circuit substrate 100 in a flip-die bonding manner.

Figure 7:
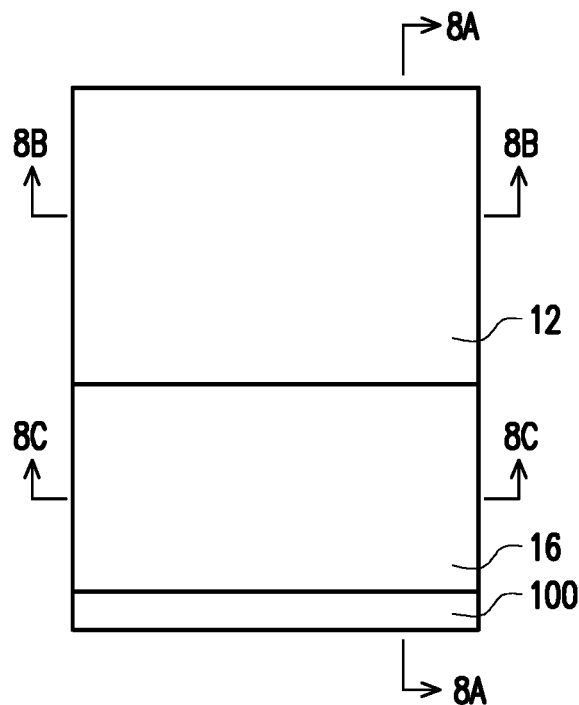
FIG. 7 is an enlarged view illustrating the Y portion of the circuit substrate depicted in FIG. 5.
Figure 8A:
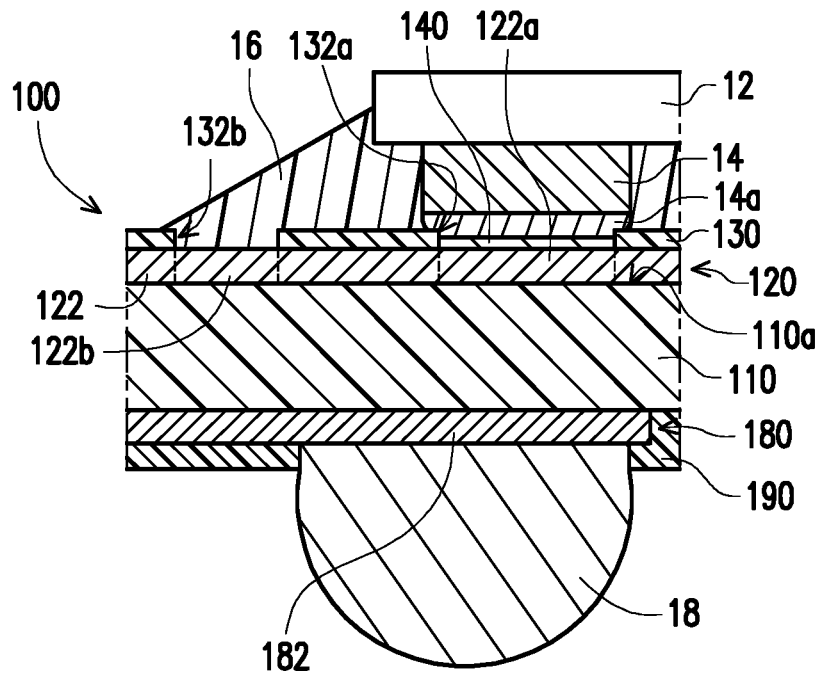
FIG. 8A is a cross-sectional view illustrating a portion of the circuit substrate depicted in FIG. 7 taken along line 8A-8A.
Figure 8B:
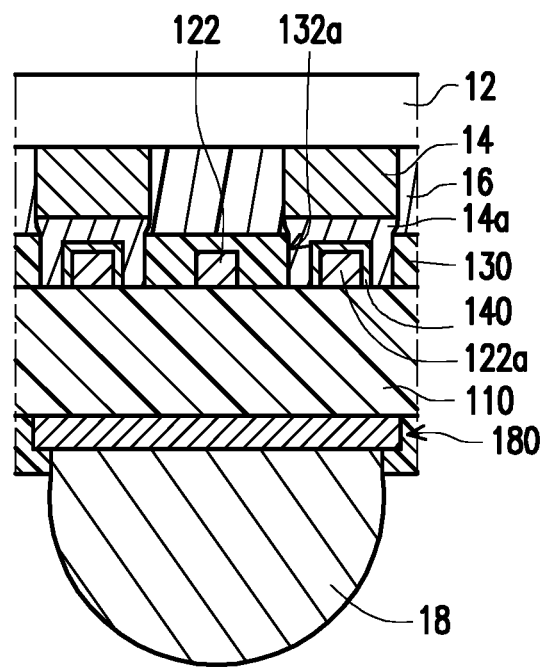
FIG. 8B is a cross-sectional view illustrating a portion of the circuit substrate depicted in FIG. 7 taken along line 8B-8B.
Figure 8C:
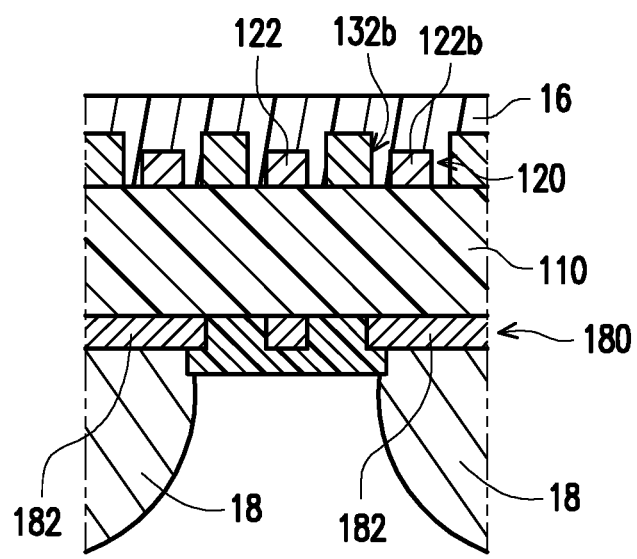
FIG. 8C is a cross-sectional view illustrating a portion of the circuit substrate depicted in FIG. 7 taken along line 8C-8C.

FIG. 7 is an enlarged view illustrating the Y portion of the circuit substrate depicted in FIG. 5. FIG. 8A is a cross-sectional view illustrating a portion of the circuit substrate depicted in FIG. 7 taken along line 8A-8A. FIG. 8B is a cross-sectional view illustrating a portion of the circuit substrate depicted in FIG. 7 taken along line 8B-8B. FIG. 8C is a cross-sectional view illustrating a portion of the circuit substrate depicted in FIG. 7 taken along line 8C-8C. With reference to FIG. 7 and FIG. 8A to FIG. 8C, in the present embodiment, the semiconductor package structure 10 has a plurality of conductive bumps 14 located between the die 12 and the circuit substrate 100, so as to connect the die 12 to the thickening conductive layers 140. In the present embodiment, each of the conductive bumps 14 is connected to the corresponding thickening conductive layer 140 through a solder material 14a.

With reference to FIG. 7 and FIG. 8A to FIG. 8C, the semiconductor package structure 10 further includes an underfill 16 placed between the die 12 and the circuit substrate 100, and the plating openings 132b are filled with the underfill 16 to cover the plating segments 122b. Thereby, the plating segments 122b can be encapsulated with insulation. In the present embodiment, the underfill 160 is distributed over the die bonding region B shown in FIG. 1, and the distribution boundary of the underfill 160 is slightly greater than the boundary of the die 12. Besides, the semiconductor package structure 10 described in the present embodiment further includes a plurality of conductive balls 18 respectively connected to the bonding pads 182, so as to connect the next-level electronic device, such as a motherboard, a module board, and so on.

Figure 9A:
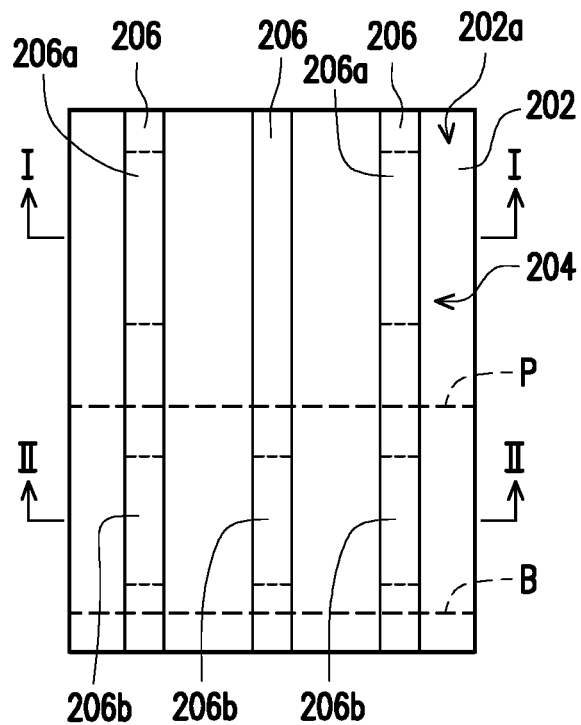
FIG. 9A to FIG. 9G are partial top views illustrating a process for fabricating a circuit substrate according to another embodiment of the invention.
Figure 10A:
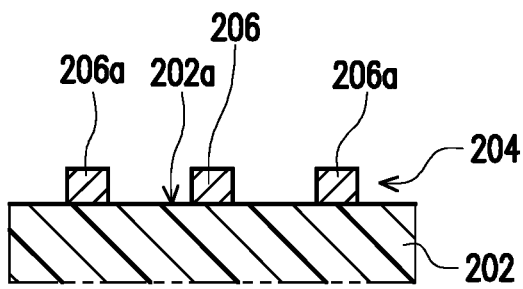
FIG. 10A to FIG. 10G are cross-sectional views illustrating an upper half of the circuit substrate depicted in FIG. 9A to FIG. 9G taken along line I-I.
Figure 11A:
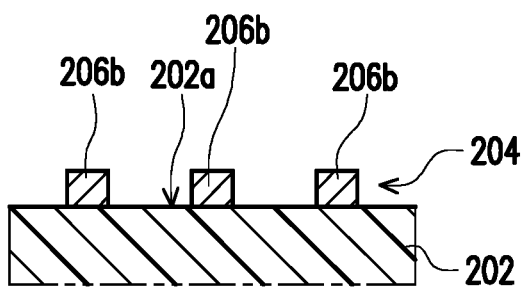
FIG. 11A to FIG. 11G are cross-sectional views illustrating an upper half of the circuit substrate depicted in FIG. 9A to FIG. 9G taken along line II-II.

FIG. 9A to FIG. 9G are partial top views illustrating a process for fabricating a circuit substrate according to another embodiment of the invention. These are similar to that depicted in FIG. 2, i.e., the enlarged X portion of the circuit substrate depicted in FIG. 1. FIG. 10A to FIG. 10G are cross-sectional views illustrating an upper half of the circuit substrate depicted in FIG. 9A to FIG. 9G taken along line I-I. FIG. 11A to FIG. 11G are cross-sectional views illustrating an upper half of the circuit substrate depicted in FIG. 9A to FIG. 9G taken along line II-II. In the present embodiment, the upper half of the circuit substrate is exemplarily described. With reference to FIG. 9A, FIG. 10A, and FIG. 11A, a circuit stack 202 and a patterned conductive layer 204 are provided. Here, the circuit stack 202 has a surface 202a, the patterned conductive layer 204 is located on the surface 202a and has a plurality of traces 206, and each of the traces 206 has a bonding segment 206a and a plating segment 206b.

Figure 9B:
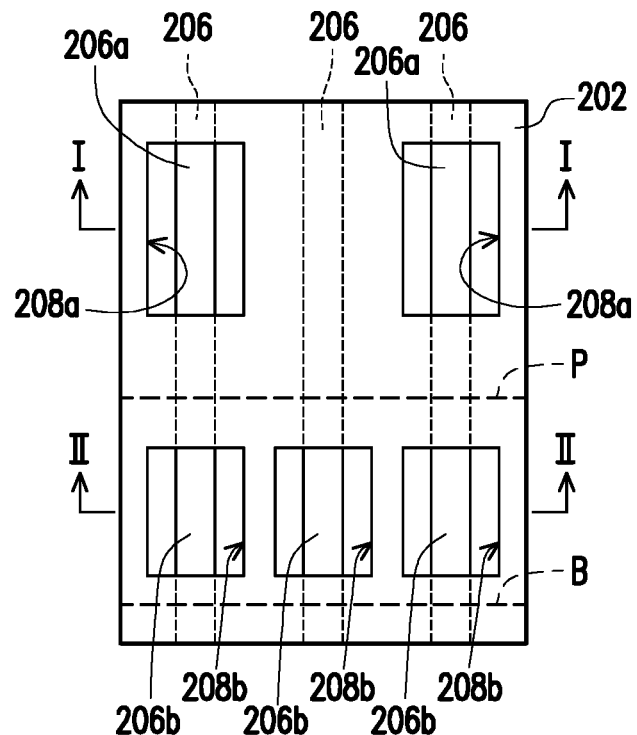
Figure 10B:
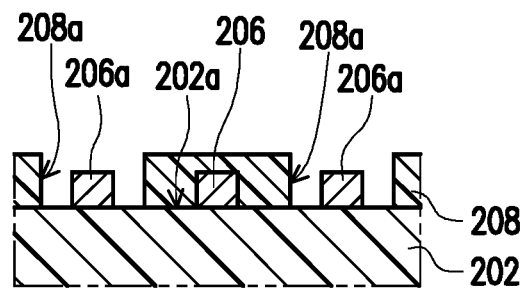
Figure 11B:
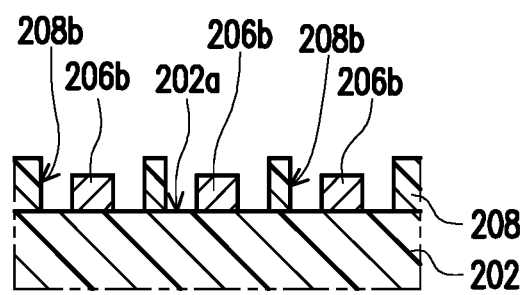

With reference to FIG. 9B, FIG. 10B, and FIG. 11B, a dielectric layer 208 (e.g., a solder mask layer) is formed to cover the surface 202a and the patterned conductive layer 204, and the dielectric layer 208 has a plurality of bonding openings 208a and a plurality of plating openings 208b. The dielectric layer 208 may be a solder mask layer, for example. The solder mask layer is used in the invention, which is different from the bonding technology of completely exposing a die bonding region without solder mask layers in the related art; so that the using of the solder mask layer can increased the bonding density as describing as the following. Each of the bonding openings 208a exposes a corresponding bonding segment 206a, and each of the plating openings 208b exposes a corresponding plating segment 206b. In the present embodiment, the circuit stack 202 has a die bonding region B, and the bonding openings 208a and the plating openings 208b are located in the die bonding region B. In another embodiment that is not shown in the drawings, when the pitch between the adjacent traces 206 is reduced, the plating openings 208b may be replaced by a relatively large plating opening. Namely, the relatively large plating opening simultaneously exposes a plurality of the traces 206 and the corresponding plating segments 206b.

Figure 9C:
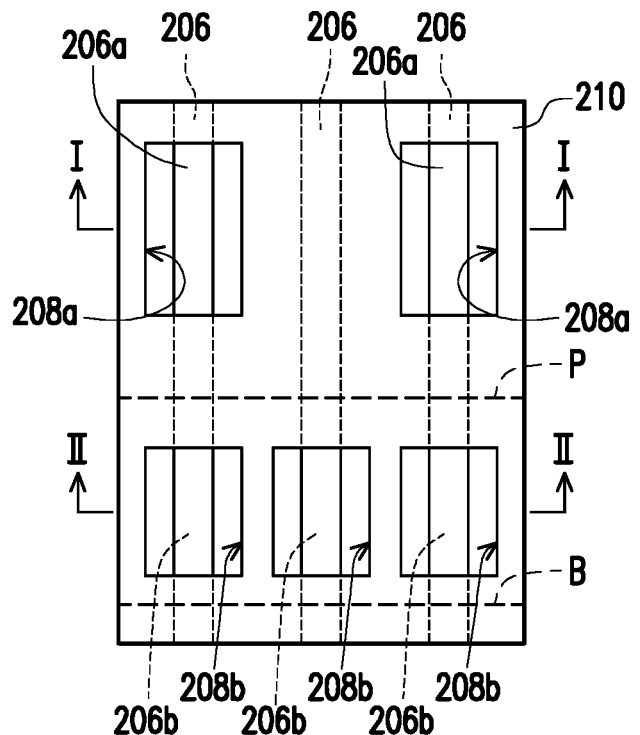
Figure 10C:
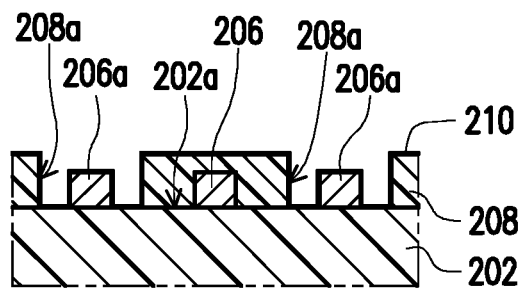
Figure 11C:
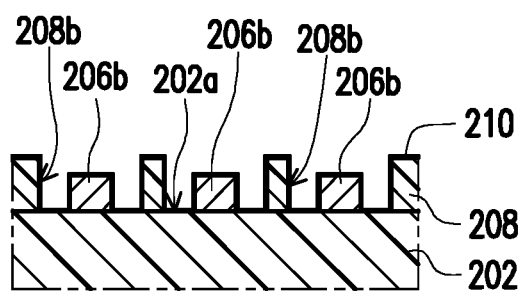
Figure 9D:
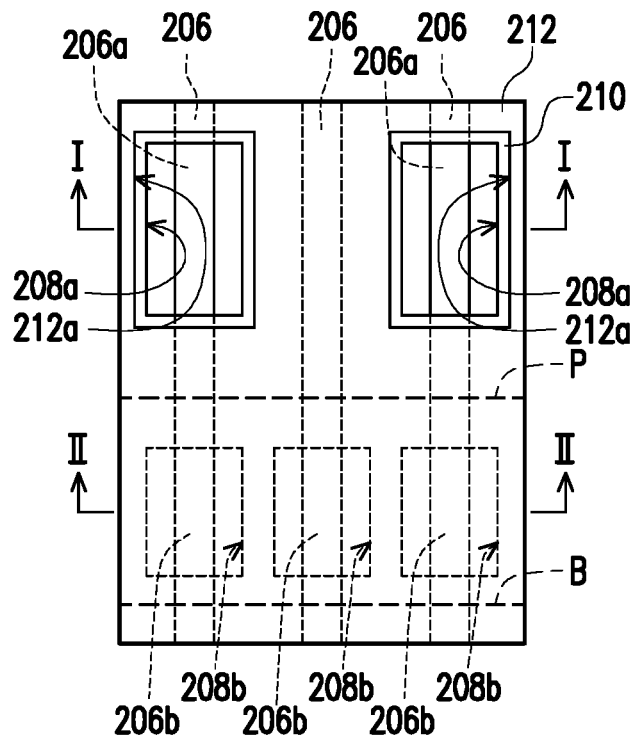
Figure 10D:
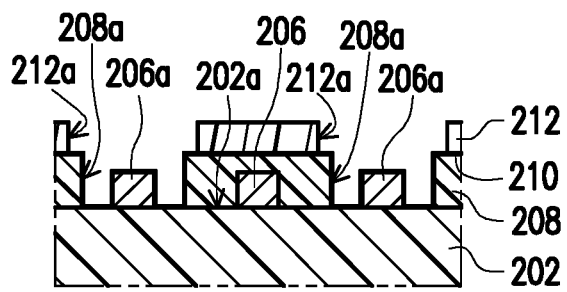
Figure 11D:
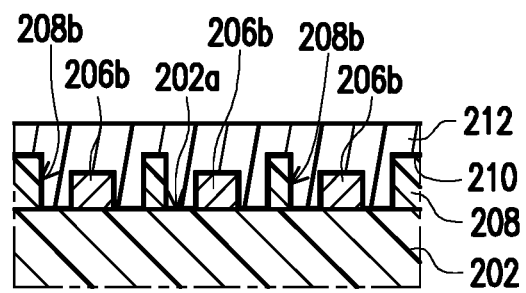
Figure 9E:
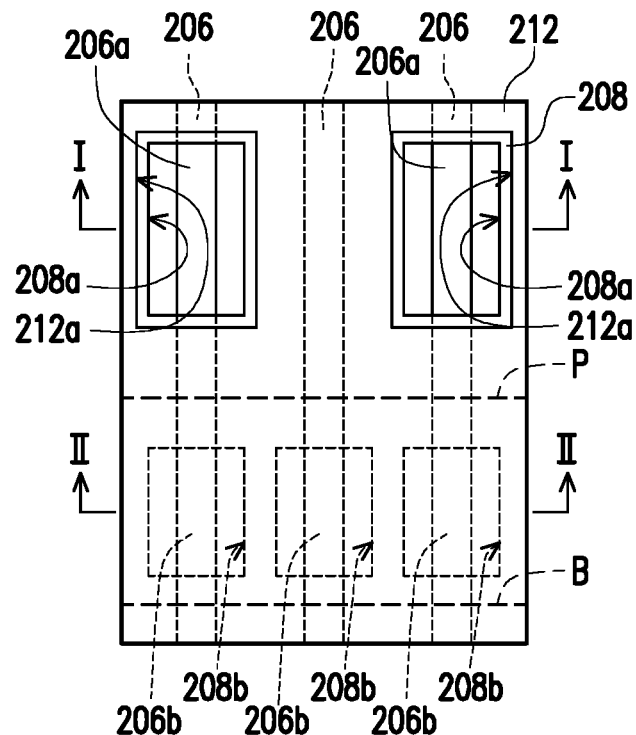
Figure 10E:
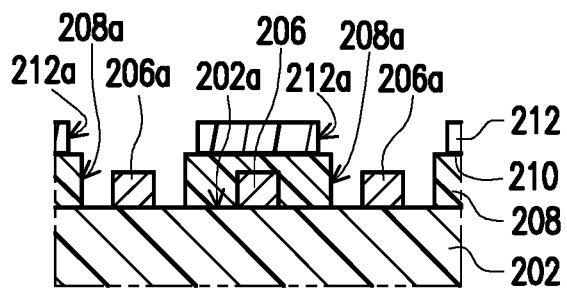
Figure 11E:
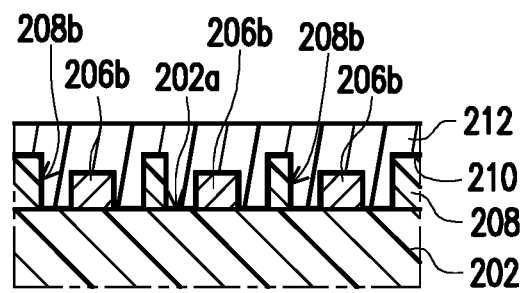

With reference to FIG. 9C, FIG. 10C, and FIG. 11C, a plating seed layer 210 is formed to cover the surface 202a, the bonding segments 206a, the plating segments 206b, and the dielectric layer 208. With reference to FIG. 9D, FIG. 10D, and FIG. 11D, a mask 212 is formed to cover the plating seed layer 210. Here, the mask 212 has a plurality of mask openings 212a, and each of the mask openings 212a exposes a portion of the plating seed layer 210 on the corresponding bonding segment 206a. With reference to FIG. 9E, FIG. 10E, and FIG. 11E, the plating seed layer 210 is etched with use of the mask 212 as an etching mask, so as to remove the portions of the plating seed layer 210 on the corresponding bonding segments 206a and expose the corresponding bonding segments 206a.

Figure 9F:
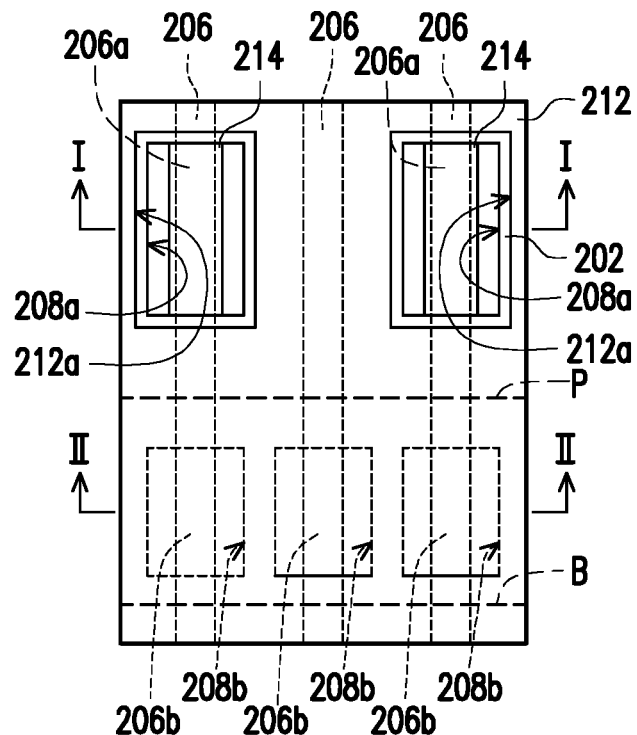
Figure 10F:
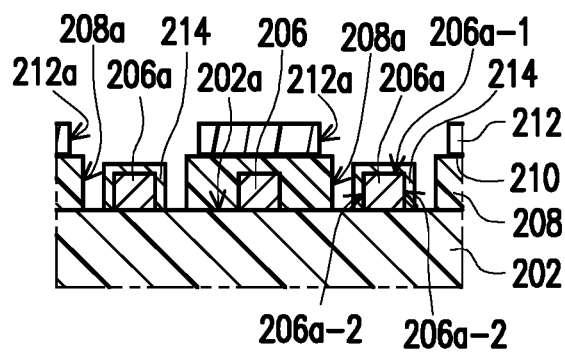
Figure 11F:
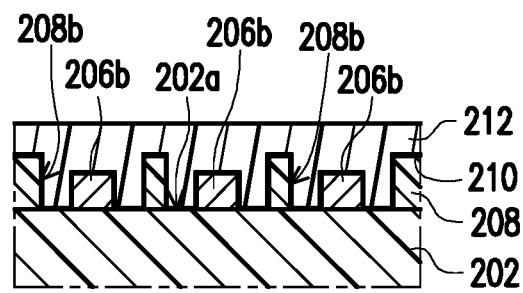

With reference to FIG. 9F, FIG. 10F, and FIG. 11F, after the plating seed layer 210 is etched, a thickening conductive layer 214 is plated on each of the bonding segments 206a through the plating seed layer 210 and the traces 206 with use of the mask 10 as a plating mask. Similar to the bonding segments 122a shown in FIG. 4A, each of the bonding segments 206a has a top surface 206a-1 and two side surfaces 206a-2. The top surface 206a-1 is away from the surface 202a, the two side surfaces 206a-2 respectively extend from two sides of the top surface 206a-1 to the surface 202a, and each of the corresponding thickening conductive layers 214 is located on the top surface 206a-1 and the two side surfaces 206a-2 of the corresponding bonding segment 206a. It is noted that there is no the plating seed layer 210 on the bonding segments 206a, but there is the plating seed layer 210 on the plating segments 206b. Because the bonding segments 206a and the plating segments 206b are both belonged to the same trace 206, the thickening conductive layer 214 is plated and formed on each of the bonding segments 206a through the plating seed layer 210 on the plating segments 206b. Therefore, the plating segment 206b is considered as a plating conducting path segment. In detail, an outside power is applied to a contact region (not shown) of the trace 206, and the contact region (not shown) of the trace 206 is exposed to accept the outside power at the edge of the circuit substrate 100 (shown as FIG. 6), so that the thickening conductive layer 214 is formed on the bonding segment 206a through the plating conducting path segment of the plating segment 206b.

Figure 9G:
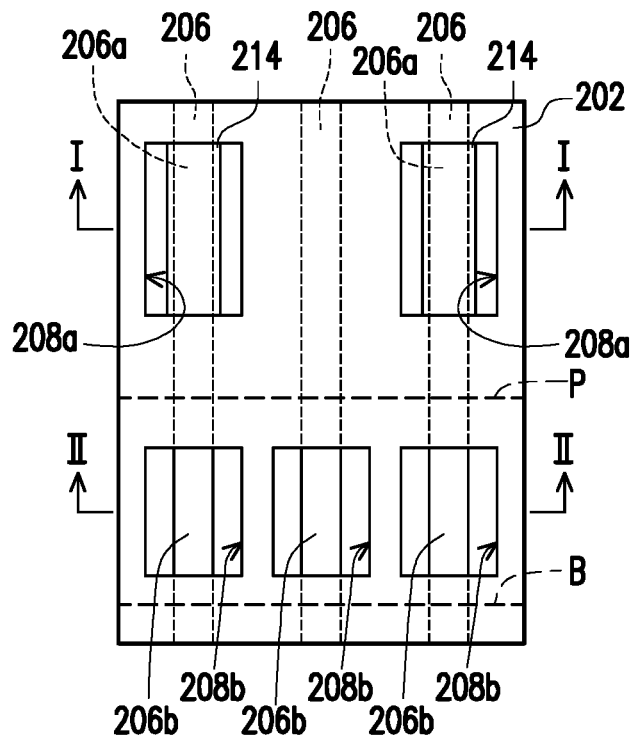
Figure 10G:
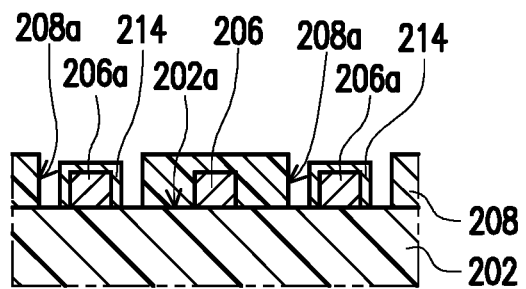
Figure 11G:
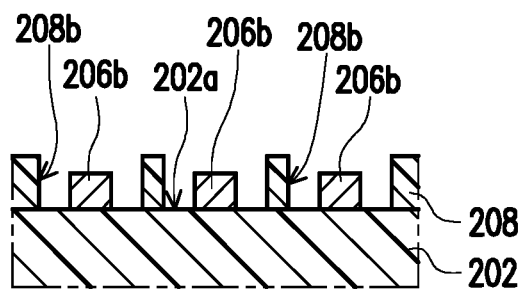

With reference to FIG. 9G, FIG. 10G, and FIG. 11G, after the thickening conductive layers 214 are plated, the mask 212 and the plating seed layer 210 are removed.

To sum up, the patterned conductive layer configured on the circuit stack is covered by the dielectric layer (e.g., the solder mask layer), while the bonding segments of the traces of the patterned conductive layer are exposed, so as to reduce the pitch of the adjacent bonding segments. Particularly, other traces may exist between the adjacent bonding segments, and the adjacent bonding segments are not apt to be bridged to each other. Besides, the thickening conductive layers are formed on the bonding segments, so as to increase the widths and the heights of the bonding segments and thereby expand the bonding area.

Moreover, in the process for fabricating the circuit substrate described herein, the plating segments of the traces are exposed by the plating openings of the dielectric layer, and the exposed plating segments can then serve as the current path for plating the thickening conductive layers on the bonding segments of the traces. The plating openings may also be filled with the underfill, so as to encapsulate the plating segments of the traces and simultaneously insulate the encapsulated plating segments.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A process for fabricating a circuit substrate, the process comprising:

providing a circuit stack and a patterned conductive layer, wherein the circuit stack has a surface, the patterned conductive layer is located on the surface of the circuit stack and has a plurality of traces, and each of the traces has a bonding segment and a plating segment;

forming a dielectric layer to cover the surface of the circuit stack and the patterned conductive layer, wherein the dielectric layer has a plurality of bonding openings and a plurality of plating openings, each of the bonding openings exposes a corresponding bonding segment of the bonding segments, and each of the plating openings exposes a corresponding plating segment of the plating segments;

forming a plating seed layer to cover the surface of the circuit stack, the bonding segments, the plating segments, and the dielectric layer;

forming a mask to cover the plating seed layer, wherein the mask has a plurality of mask openings, and each of the mask openings exposes a portion of the plating seed layer on a corresponding bonding segment of the bonding segments;

etching the plating seed layer with use of the mask as an etching mask, so as to remove the portions of the plating seed layer on the corresponding bonding segments and expose the corresponding bonding segments, wherein the plating segments is covered by the plating seed layer, plating a thickening conductive layer on each of the bonding segments through the plating seed layer and the traces with use of the mask as a plating mask; and removing the mask and the plating seed layer.

2. The process as recited in claim 1, wherein each of the bonding segments has a top surface and two side surfaces, the top surface is away from the surface of the circuit stack, the two side surfaces respectively extend from two sides of the top surface to the surface of the circuit stack, and each of the thickening conductive layers is located on the top surface and the two side surfaces of the corresponding bonding segment.

3. The process as recited in claim 1, wherein the circuit stack has a die bonding region, and the bonding openings and the plating openings are located in the die bonding region.

4. The process as recited in claim 1, wherein the dielectric layer is a solder mask layer.

5. The process as recited in claim 1, wherein a total of a width of each of the thickening conductive layers and a width of the corresponding bonding segment is greater than a width of the corresponding traces, and a total of a thickness of each of the thickening conductive layers and a thickness of the corresponding bonding segments is greater than a thickness of the corresponding trace.

* * * * *